(12) United States Patent
Chen

(10) Patent No.: US 11,175,706 B2
(45) Date of Patent: Nov. 16, 2021

(54) FIXING DEVICE FOR FIXING DATA PROCESSOR

(71) Applicant: HONGFUJIN PRECISION ELECTRONICS(TIANJIN)CO., LTD., Tianjin (CN)

(72) Inventor: Kuo-Feng Chen, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 49 days.

(21) Appl. No.: 16/699,946

(22) Filed: Dec. 2, 2019

(65) Prior Publication Data

US 2021/0004063 A1    Jan. 7, 2021

(30) Foreign Application Priority Data

Jul. 2, 2019 (CN) .......................... 201910591152.6

(51) Int. Cl.
| G06F 1/18 | (2006.01) |
| H05K 5/02 | (2006.01) |
| F16B 2/10 | (2006.01) |

(52) U.S. Cl.
CPC ................ *G06F 1/187* (2013.01); *F16B 2/10* (2013.01); *H05K 5/0221* (2013.01)

(58) Field of Classification Search
CPC .......... G06F 1/187; H05K 5/0221; F16B 2/10
USPC ............................ 361/679.31–679.39, 679.58
See application file for complete search history.

(56) References Cited

U.S. PATENT DOCUMENTS

| 7,729,110 | B2* | 6/2010 | Zhang | G11B 33/124 361/679.33 |
| 8,976,520 | B2* | 3/2015 | Yang | G06F 1/187 361/679.37 |
| 2004/0125555 | A1* | 7/2004 | Chen | G11B 33/124 361/679.33 |
| 2012/0104916 | A1* | 5/2012 | Peng | G06F 1/187 312/326 |
| 2015/0043152 | A1* | 2/2015 | Zhang | G11B 33/124 361/679.37 |

FOREIGN PATENT DOCUMENTS

| CN | 2757211 Y | * | 2/2006 | ............. G06F 1/187 |
| CN | 2842534 Y | * | 11/2006 | ............. G06F 1/187 |

* cited by examiner

*Primary Examiner* — Eret C McNichols
*Assistant Examiner* — Ding Y Tan
(74) *Attorney, Agent, or Firm* — ScienBiziP, P.C.

(57) ABSTRACT

A device (belt device) for fixing and securing a data processing device in a chassis includes a first bracket, a second bracket, and a buckle slidably connected to the second bracket. The first bracket is rotatable about the second bracket. The buckle can slide to and engage with the second bracket to connect the first bracket with the second bracket, the cavity defined by the first bracket and the second bracket of the belt device can receive and hold a data processor in place without tools being needed either for mounting or demounting the processing device.

18 Claims, 7 Drawing Sheets

FIXING DEVICE FOR FIXING DATA PROCESSOR

FIELD

The subject matter herein generally relates to computer construction.

BACKGROUND

The data processor in the computer, such as a hard disk drive, a data storage unit, etc., is usually fixed in a bracket and then installed in the computer's chassis. The data processor is usually mounted on the bracket by screws, and the bracket is mounted on the chassis by screws. Such assembly processes are time consuming.

Therefore, there is room for improvement within the art.

BRIEF DESCRIPTION OF THE DRAWINGS

Implementations of the present technology will now be described, by way of embodiments with reference to the attached figures.

DETAILED DESCRIPTION

Figure 1:
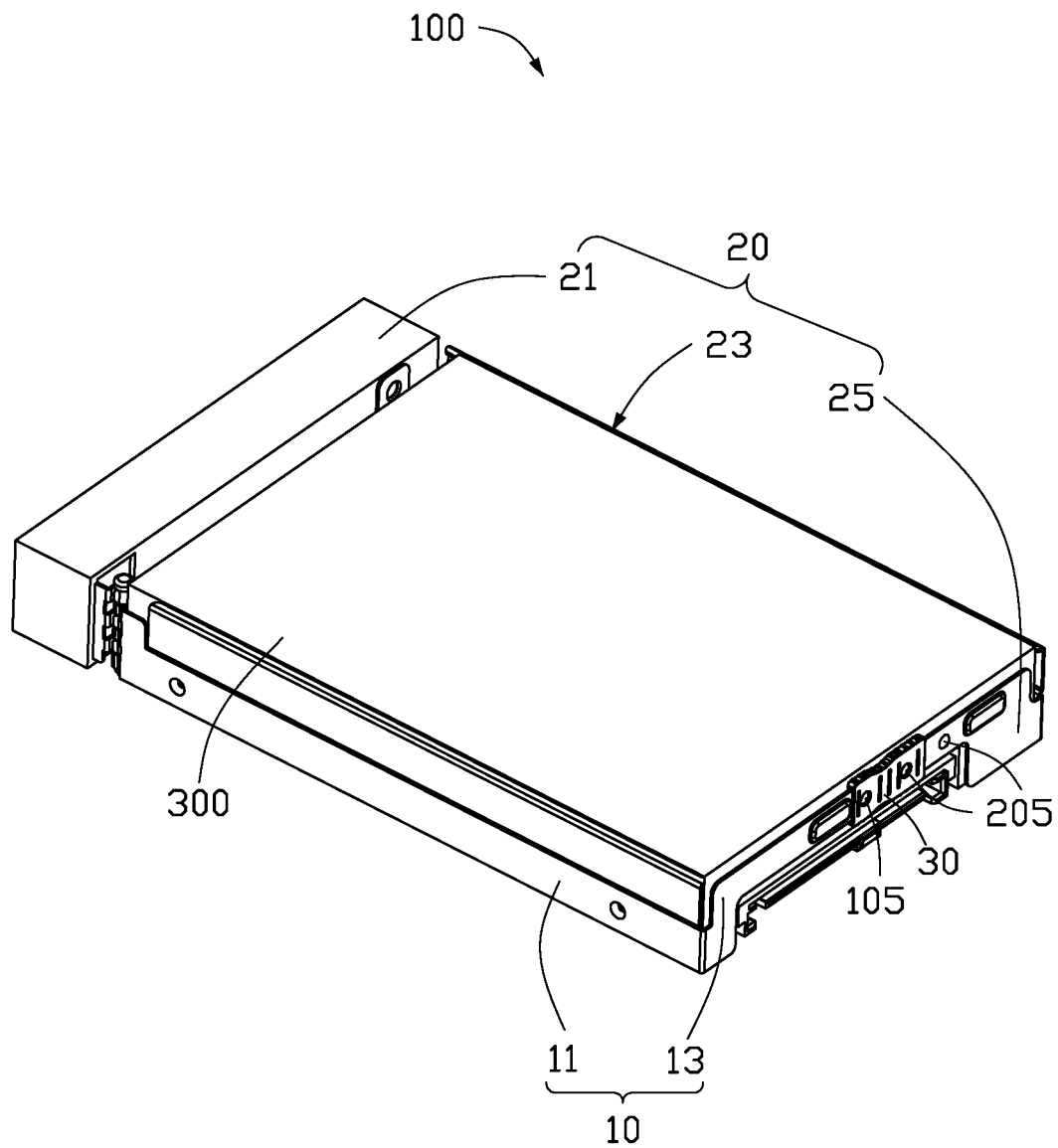
FIG. 1 is an isometric view of a fixing device for fixing a data processor in a chassis according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to show details and features of the present disclosure better. The disclosure is by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
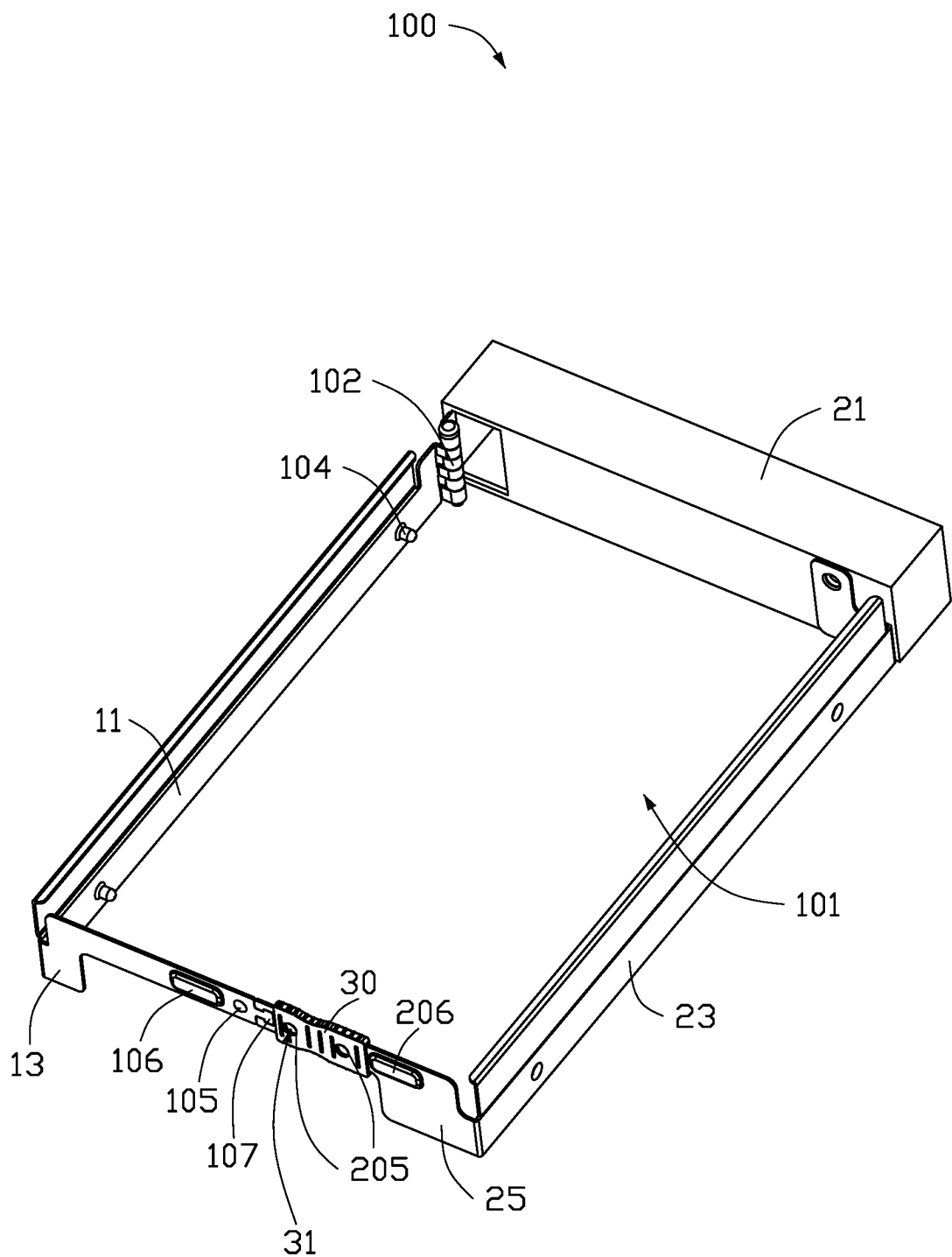
FIG. 2 is an isometric view of the fixing device in FIG. 1.

Referring to FIGS. 1 and 2, a fixing device 100 for fixing a data processor 300 in a computer chassis is provided. The fixing device 100 includes a first bracket 10, a second bracket 20, and a sliding buckle 30. The first bracket 10 and the second bracket 20 are bent from a sheet, but are not limited thereto. The first bracket 10 and the second bracket 20 define a cavity 101 to receive and hold the data processor 300. One end of the first bracket 10 and one end of the second bracket 20 are rotatably connected to two first rotating shafts 102. The other end of first bracket 10 facing away from the first rotating shaft 102 is a first free end 103. The other end of second bracket 20 facing away from the first rotating shaft 102 is a second free end 203. The first bracket 10 and the second bracket 20 are rotatable away from each other to enable placement of the data processor 300 in the cavity 101. The sliding buckle 30 is slidably disposed on the first bracket 10 or the second bracket 20. The sliding buckle 30 can be fixed to the first free end 103 and the second free end 203, so that the first bracket 10 and the second bracket 20 support and fix the data processor 300 in the manner of a belt.

Figure 3:
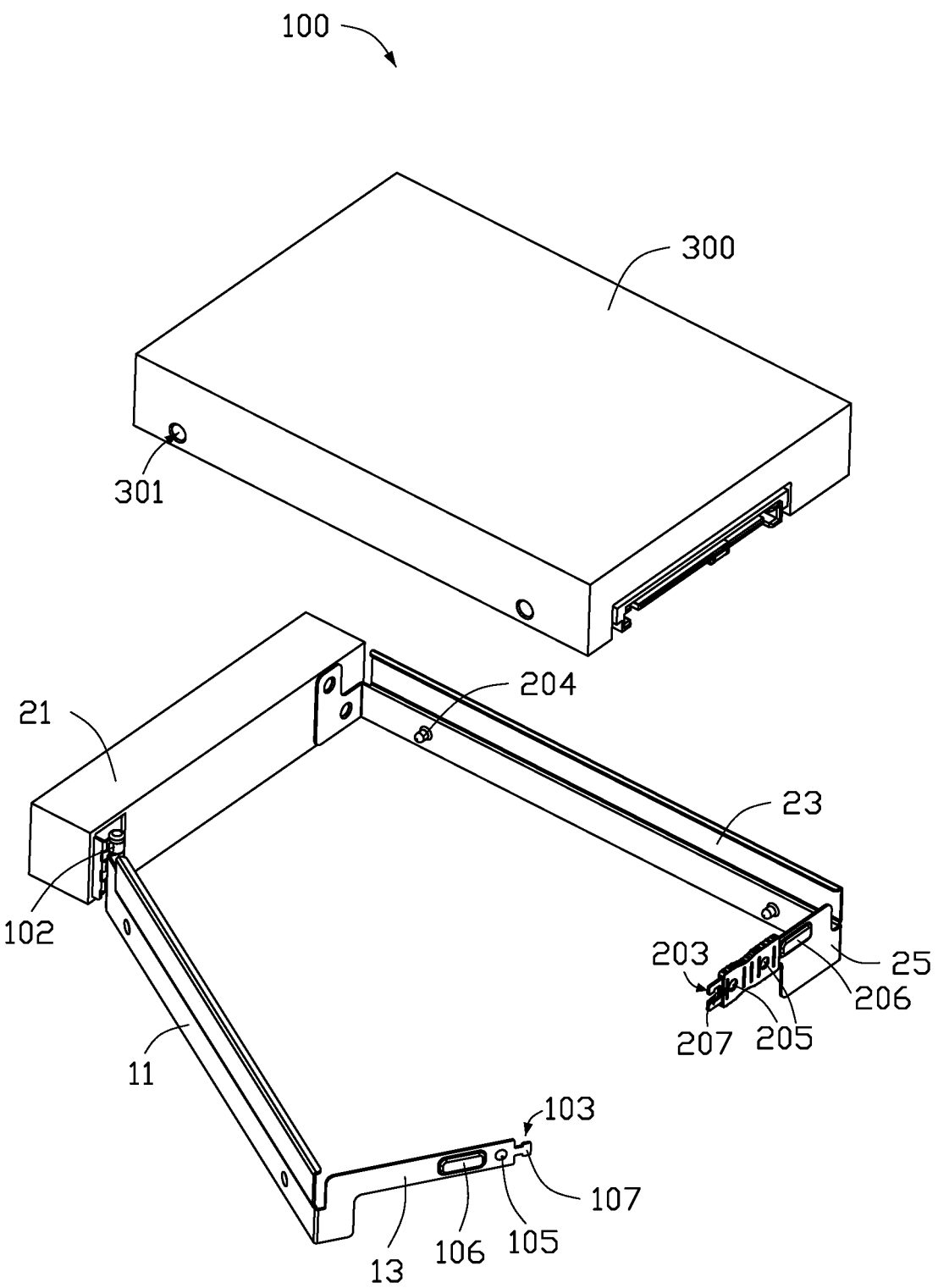
FIG. 3 is similar to FIG. 1, but with the data processor taken out of the fixing device.

Referring to FIG. 2 and FIG. 3, the first bracket 10 includes a first connecting portion 11 and a first fastening portion 13 connected to the first connecting portion 11. The second bracket 20 includes a second connecting portion 21, a third connecting portion 23, and a second fastening portion 25 sequentially connected. The second connecting portion 21, the third connecting portion 23, the second fastening portion 25, the first fastening portion 13 and the first connecting portion 11 are sequentially connected to each other to form the cavity 101. The first connecting portion 11 is opposite to the third connecting portion 23. The first connecting portion 11 is rotatably connected to the second connecting portion 21. The first fastening portion 13 and the second fastening portion 25 are opposite to the second connecting portion 21 and are engageable with the sliding buckle 30.

A number of first support portions 104 and a number of second support portions 204 support the data processor 300 at the sides. Specifically, the first support portions 104 are disposed on the first connecting portion 11, and the second support portions 204 are disposed on the third connecting portion 23. Each first support portion 104 is opposite a second support portion 204, but are not limited to this arrangement. The first support portion 104 and the second support portion 204 are cylindrical and are insertable in holes 301 in the data processor 300.

The first connecting portion 11 rotates in a direction away from the second fastening portion 25 to allow the data processor 300 to enter the cavity 101, and the second support portion 204 is inserted into the hole 301. The first connecting portion 11 rotates toward the second fastening portion 25 to insert the first support portion 104 into the hole 301. The sliding buckle 30 can then be fastened to the first fastening portion 13 and the second fastening portion 25 to fix and secure in place the data processor 300.

It can be understood that in other embodiments, the first support portion 104 and the second support portion 204 can also be omitted. The slider 30 can engage with the first bracket 10 and the second bracket 20, and the first bracket 10 and the second bracket 20 clamp and fix the data processor 300 in place without portions 104 and 204.

Figure 4:
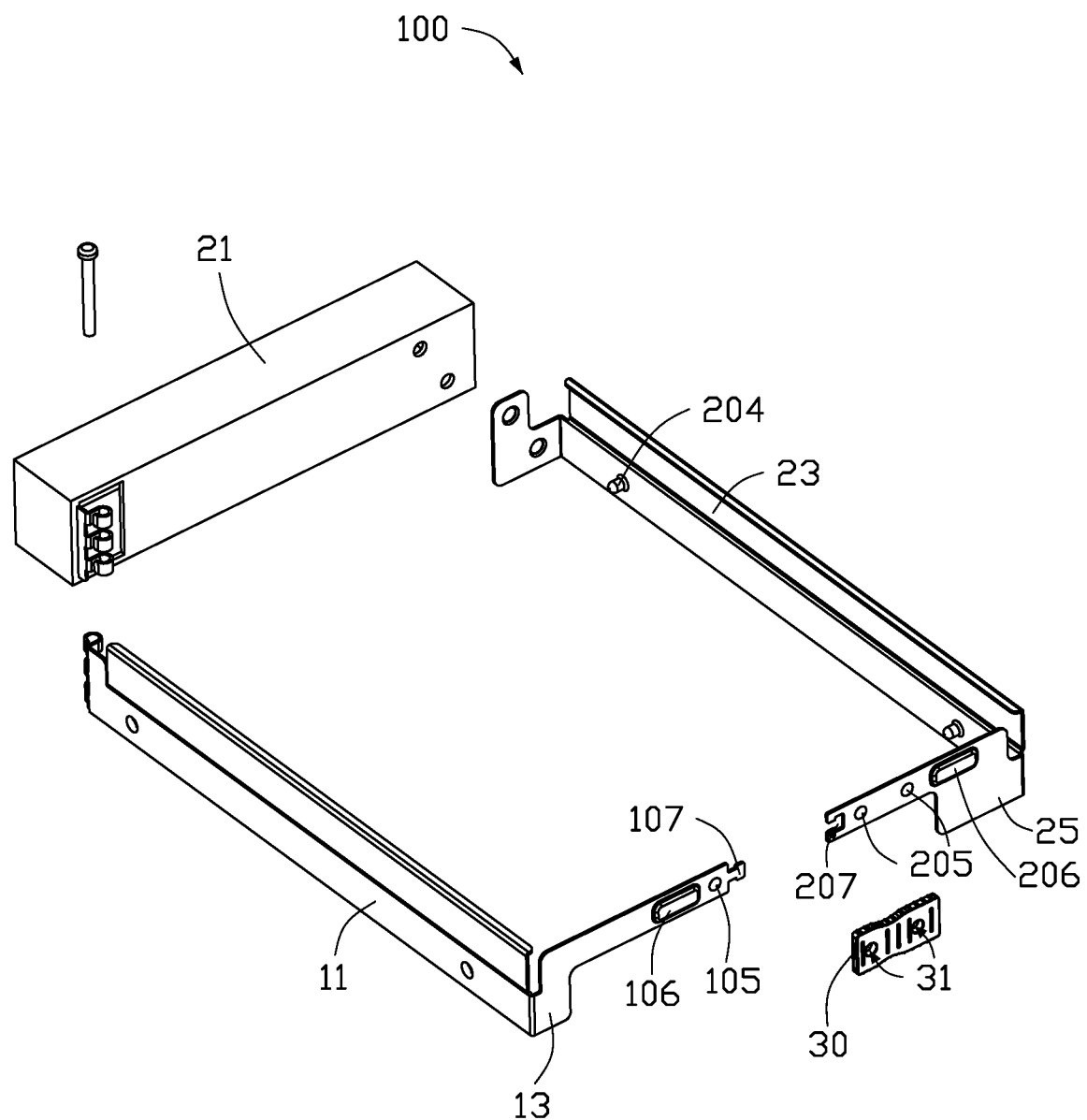
FIG. 4 is an exploded isometric view of the fixing device in FIG. 1.

Referring to FIG. 1 and FIG. 4, the sliding buckle 30 defines two button holes 31. The first fastening portion 13 includes a first protruding fastening portion 105, and the second fastening portion 25 includes two second protruding fastening portions 205 spaced from each other. The first protruding fastening portion 105 and the two second protruding fastening portions 205 are configured to engage in the button holes 31. When a button hole 31 is engaged with two second protruding fastening portions 205, the first fastening portion 13 and the second fastening portion 25 are disconnected, and the first bracket 10 can rotate about the second bracket 20.

It can be understood that, in other embodiments, the sliding buckle 30 can also be slidably disposed on the first bracket 10 as long as the sliding buckle 30 can be buckled with the first bracket 10 and the second bracket 20.

It can be understood that in other embodiments, the number of button holes 31 can be three or other number. The number of the first protruding fastening portions 105 can also be two, and the number of the second protruding fastening portions 205 can also be one.

Referring to FIG. 1 and FIG. 4, the first fastening portion 13 includes a first stopping portion 106, the second fastening portion 25 includes a second stopping portion 206. The first stopping portion 106 and the second stopping portion 206 are located at sides of the sliding buckle 30 to limit a moving distance of the sliding buckle 30. It can be understood that in other embodiments, the first stopping portion 106 and the second stopping portion 206 can also be omitted.

Referring to FIG. 2 and FIG. 3, the first free end 103 includes an inserting portion 107, and the second free end 203 defines a slot 207. The inserting portion 107 is received in the slot 207 to restrict the first free end 103 and the second free end 203 from moving away from each other vertically. It can be understood that in other embodiments, the slot 207 can also be disposed at the first free end 103, and the inserting portion 107 disposed at the second free end 203. In another embodiment, the inserting portion 107 and the slot 207 can also be omitted.

The first bracket 10 and the second bracket 20 are made of sheet metal, and the sliding buckle 30 is injection molded, but is not limited thereto. It can be understood that in other embodiments, the first bracket 10 and the second bracket 20 can also be injection molded, and the sliding buckle 30 can also be made of sheet metal.

Figure 5:
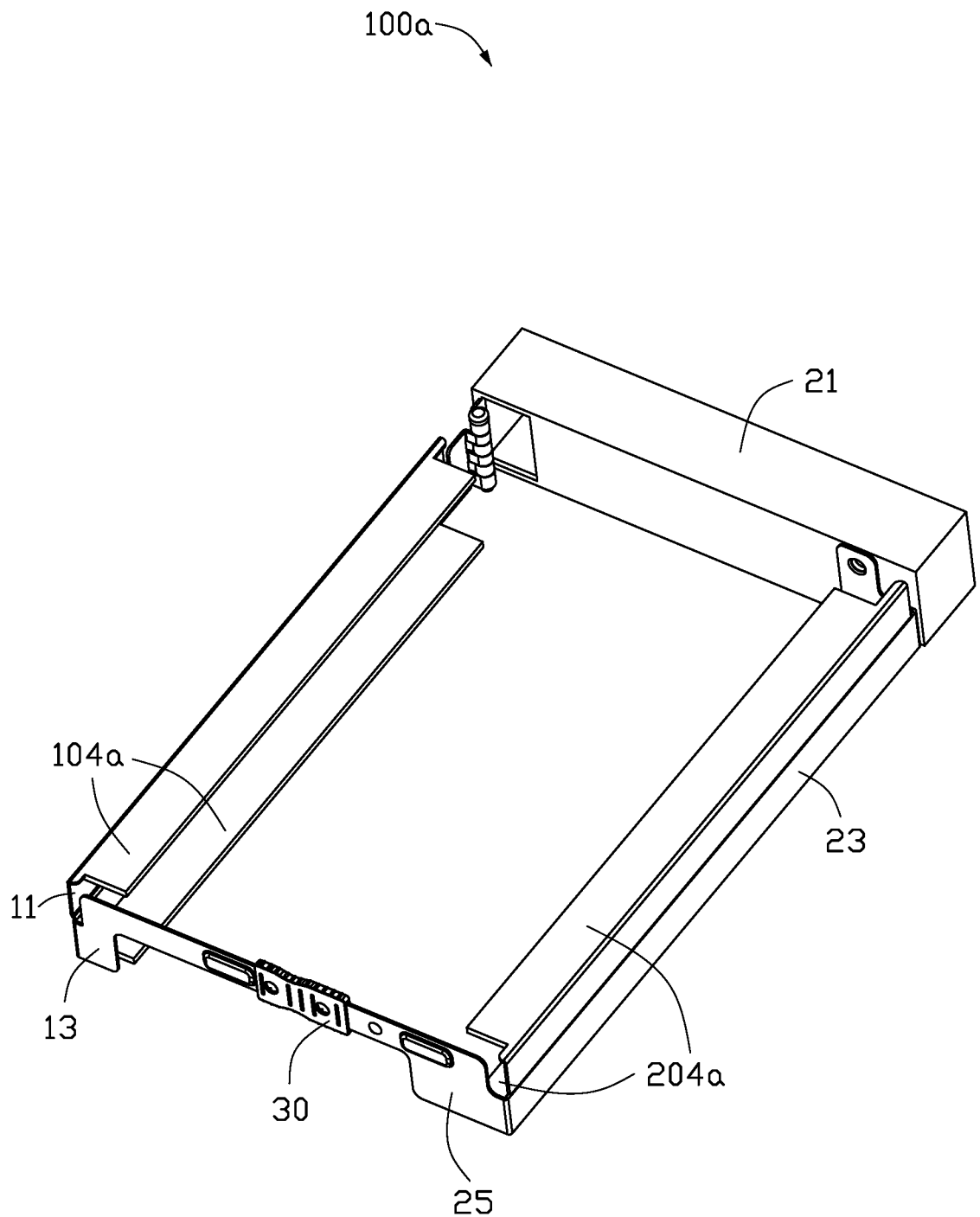
FIG. 5 is an isometric view of the fixing device according to a second embodiment.

Referring to FIG. 5, in a second embodiment, the fixing device 100a is substantially the same in structure as the fixing device 100 in the first embodiment, except in respect of the first support portions 104a and the second support portions 204a of the fixing device 100a. Specifically, the two sides of the first connecting portion 11 respectively extend in a direction parallel to the sliding direction of the sliding buckle 30 to form first supporting portions 104a. The first supporting portions 104a are plate-like. The two first support portions 104a abut both sides of the data processor 300. The two sides of the third connecting portion 23 respectively extend in a direction parallel to the sliding direction of the sliding buckle 30 to form the second supporting portions 204a. The second supporting portions 204a are plate-like. The two second support portions 204a abut both sides of the data processor 300. The first support portions 104a and the second support portions 204a also fix and secure the data processor 300.

Figure 6:
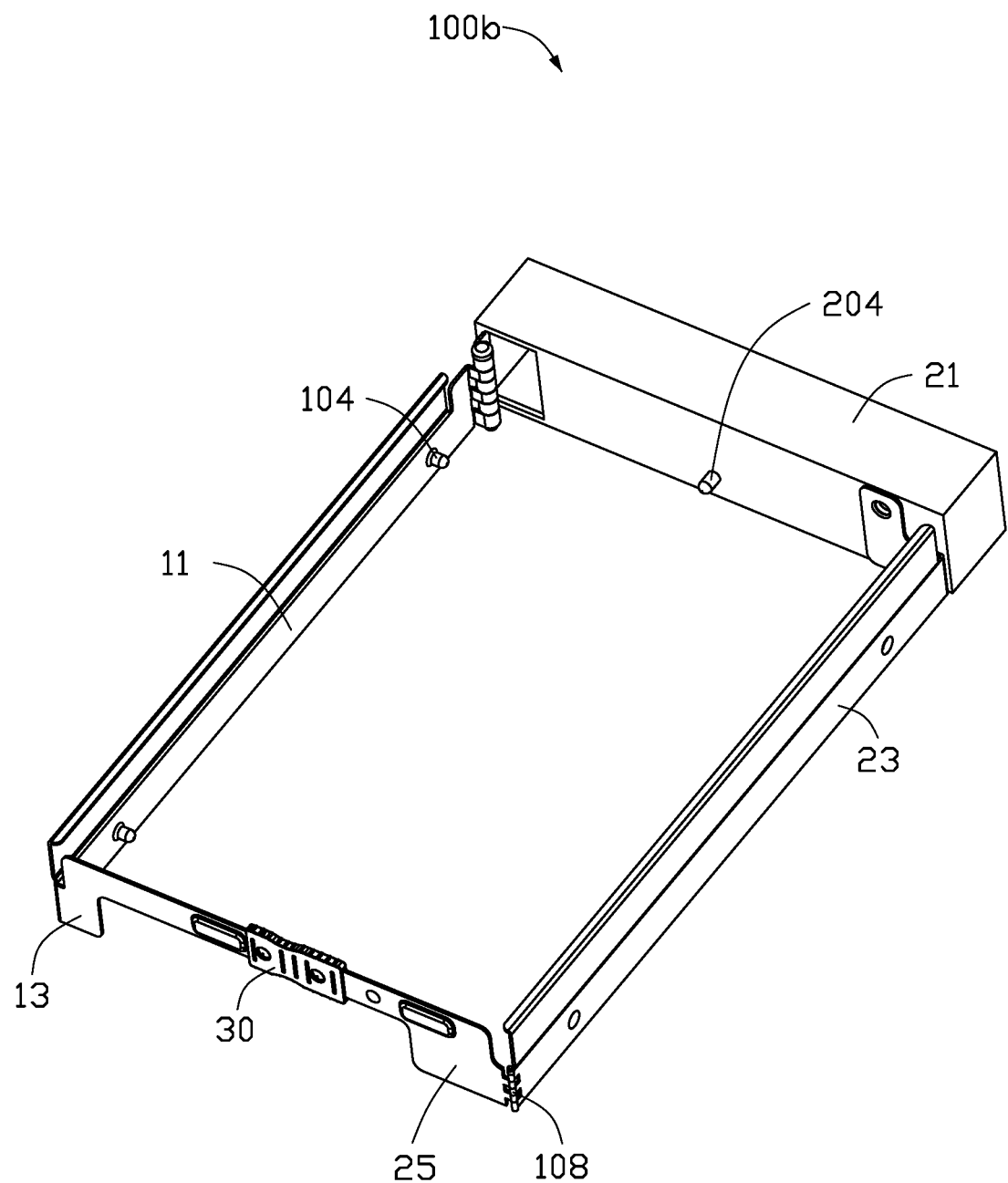
FIG. 6 is an isometric view of the fixing device according to a third embodiment.

Referring to FIG. 6, in a third embodiment, the fixing device 100b is substantially the same in structure as the fixing device 100 in the first embodiment, except that the third connecting portion 23 and the second fastening portion 25 are rotatably connected to second rotating shafts 108. The second connecting portion 21 also includes the second protruding supporting portion 204 for insertion into the hole 301 of the data processor 300 or to abut against the lower side of the data processor 300. The first connecting portion 11 rotates about the first rotating shaft 102, and the second fastening portion 25 rotates around the second rotating shaft 108 to allow the data processor 300 to enter the cavity 101. The second support portion 204 on the second connecting portion 21 and the third connecting portion 23 support and position the data processor 300. When the first fastening portion 13 and the second fastening portion 25 are engaged with the sliding buckle 30, the data processor 300 is fixed and secured to the fixing device 100b.

It can be understood that, in other embodiments, when the second support portion 204 on the second connecting portion 21 abuts against the lower side of the data processor 300, the third connecting portion 23 and the second fastening portion 25 can be a demountable connection or an integrated structure.

Figure 7:
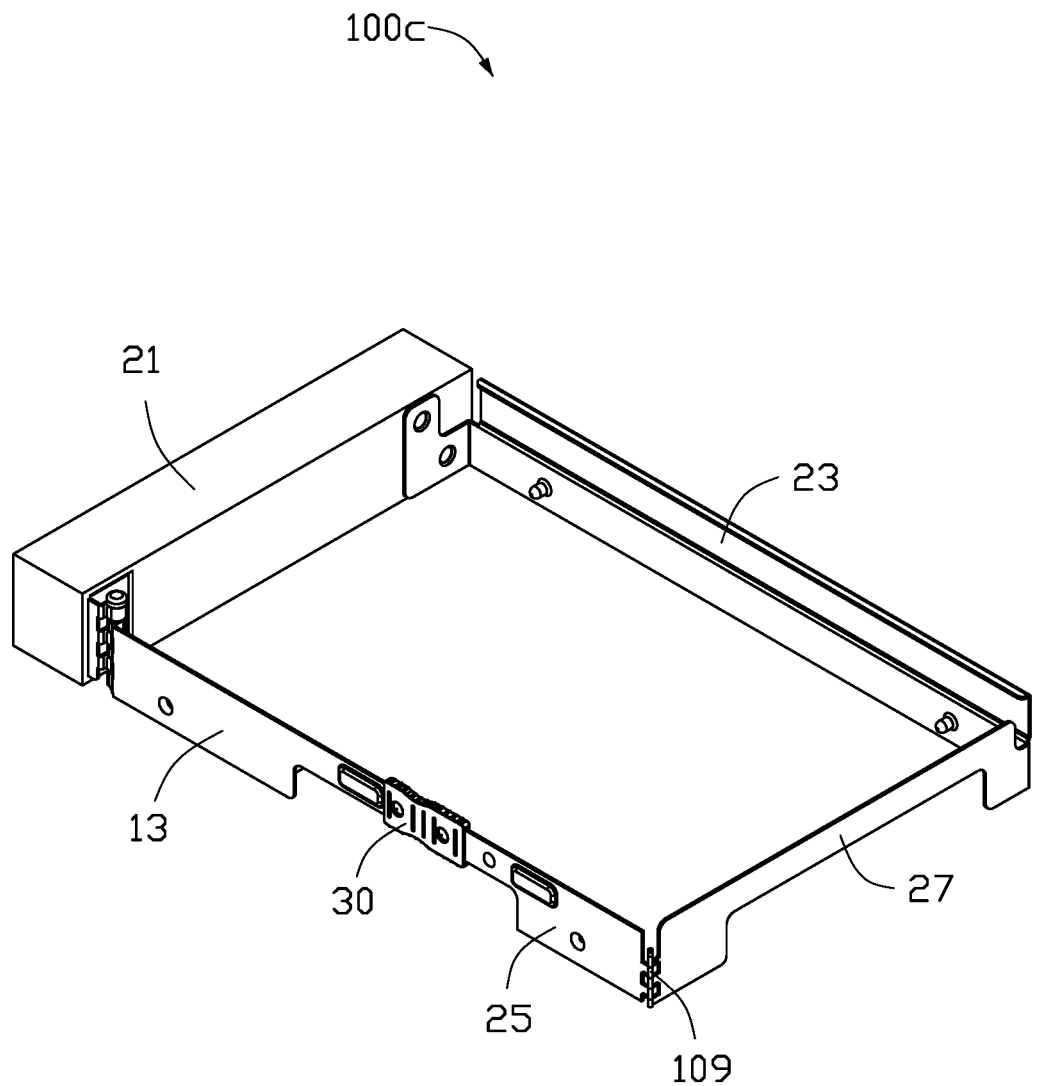
FIG. 7 is an isometric view of the fixing device according to a fourth embodiment.

Referring to FIG. 7, in a fourth embodiment, the fixing device 100c is substantially the same as the fixing device 100 in the first embodiment, except that the second bracket 20 further includes a fourth connecting portion 27 between the third connecting portion 23 and the second fastening portion 25. The first bracket 10 omits the first connecting portion 11, and the second fastening portion 25 rotatably connects to the fourth connecting portion 27 by a third rotating shaft 109. The first fastening portion 13, the second connecting portion 21, the third connecting portion 23, the fourth connecting portion 27, and the second fastening portion 25 define the cavity 101. The second connecting portion 21 is opposite to the fourth connecting portion 27. The first fastening portion 13 and the second fastening portion 25 are parallel to the third connecting portion 23 and are engageable with the sliding buckle 30.

The fixing devices 100, 100a, 100b, and 100c can receive the data processor 300 in the cavity 101 defined by the first bracket 10 and the second bracket 20. The first bracket 10 and the second bracket 20 can rotate about each other to allow the data processor 300 to enter the cavity 101, and the sliding buckle 30 can be engaged with the first fastening portion 13 and the second fastening portions 25 to fix the data processor 300. Mounting and demounting of the data processor 300 is done without tools.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A fixing device comprising:
a first bracket;
a second bracket;
a sliding buckle slidably connected to the second bracket;

wherein the first bracket is rotatable around the second bracket, the sliding buckle is slidable to the second bracket to connect the first bracket with the second bracket, the first bracket, the second bracket and the sliding buckle cooperatively define a cavity configure for receiving a data processor, the sliding buckle defines two button holes, the first bracket comprises a first protruding fastening portion, the second bracket comprises two second protruding fastening portions spaced from each other, the first protruding fastening portion and one of the two second protruding fastening portions are engaged in the two button holes to connect the first bracket to the second bracket; the sliding buckle is slidable away from the first protruding fastening portion to engage the two second protruding fastening portions in the two button holes to disconnect the first bracket from the second bracket.

2. The fixing device of claim 1, wherein the first bracket comprises a first stopping portion, and the second bracket comprises a second stopping portion, the first stopping portion and the second stopping portion are located on two sides of the sliding buckle to limit a moving distance of the sliding buckle.

3. The fixing device of claim 1, wherein one end of the first bracket comprises an inserting portion, one end of the second bracket defines a slot, the inserting portion is received in the slot when the first bracket is connected to the second bracket.

4. The fixing device of claim 1, wherein the first bracket comprises at least one first support portion, the second bracket comprises at least one second support portions, the at least one first support portion and the at least one second support portion are configured to support the data processor.

5. The fixing device of claim 4, wherein the at least one first support portion and the at least one second support portion are cylindrical and configured to be inserted holes in the data processor to support the data processor.

6. The fixing device of claim 4, wherein the at least one first supporting portion and the at least one second supporting portion extend to each other and are parallel to the sliding direction of the sliding buckle.

7. The fixing device of claim 1, wherein the first bracket comprises first connecting portion and a first fastening portion connected to the first connecting portion, the second bracket comprises a second connecting portion, a third connecting portion, and a second fastening portion that are sequentially connected, the second connecting portion, the third connecting portion, the second fastening portion, the first fastening portion and the first connecting portion are sequentially connected to each other to form the cavity, the first connecting portion is opposite to the third connecting portion, the first connecting portion is rotatably connected to the second connecting portion, the first fastening portion and the second fastening portion are opposite to the second connecting portion and are engaged with the sliding buckle.

8. The fixing device of claim 7, wherein the second fastening portion is rotatably connected to the third connecting portion.

9. The fixing device of claim 1, wherein the first bracket comprises a first fastening portion, the second bracket comprises a second connecting portion, a third connecting portion, and a second fastening portion that are sequentially connected, the first fastening portion, the second connecting portion, the third connecting portion, the fourth connecting portion and the second fastening portion are sequentially connected to each other to form the cavity, the second connecting portion is opposite to the fourth connecting portion, the first connecting portion is rotatably connected to the second connecting portion, the second fastening portion rotatably connects to the fourth connecting portion, the first fastening portion and the second fastening portion are parallel to the third connecting portion and are engaged with the sliding buckle.

10. A fixing device comprising:
a first bracket comprising a first free end;
a second bracket comprising a second free end;
a sliding buckle slidably connected to the second free end;
wherein the first bracket is rotatable around the second bracket to move away from or move close to the second free end, when the first end rotates to be opposite to the second free end, the sliding buckle is slidable along the second free end to connect the second bracket to the first bracket, the first bracket, the second bracket, and the sliding buckle cooperatively defines a cavity configured for receiving a data processor, the sliding buckle defines two button holes, the first bracket comprises a first protruding fastening portion, the second bracket comprises two second protruding fastening portions spaced from each other, the first protruding fastening portion and one of the two second protruding fastening portions are engaged in the two button holes to connect the first bracket to the second bracket; the sliding buckle is slidable away from the first protruding fastening portion to engage the two second protruding fastening portions in the two button holes to disconnect the first bracket from the second bracket.

11. The fixing device of claim 10, wherein the first bracket comprises a first stopping portion, and the second bracket comprises a second stopping portion, the first stopping portion and the second stopping portion are located at two sides of the sliding buckle to limit a moving distance of the sliding buckle.

12. The fixing device of claim 10, wherein the first free end comprises an inserting portion, the second free end defines a slot, the inserting portion is received in the slot when the first bracket is connected to the second bracket.

13. The fixing device of claim 10, wherein the first bracket comprises at least one first support portion, the second bracket comprises at least one second support portions, the at least one first support portion and the at least one second support portion are configured to support the data processor.

14. The fixing device of claim 13, wherein the at least one first support portion and the at least one second support portion are cylindrical and configured to be inserted into holes in the data processor to support the data processor.

15. The fixing device of claim 13, wherein the at least one first supporting portion and the at least one second supporting portion extend to each other and are parallel to the sliding direction of the sliding buckle.

16. The fixing device of claim 10, wherein the first bracket comprises first connecting portion and a first fastening portion connected to the first connecting portion, the second bracket comprises a second connecting portion, a third connecting portion, and a second fastening portion that are sequentially connected, the second connecting portion, the third connecting portion, the second fastening portion, the first fastening portion and the first connecting portion are sequentially connected to each other to form the cavity, the first connecting portion is opposite to the third connecting portion, the first connecting portion is rotatably connected to the second connecting portion, the first fastening portion and the second fastening portion are opposite to the second connecting portion and are engaged with the sliding buckle.

17. The fixing device of claim 16, wherein the second fastening portion is rotatably connected to the third connecting portion.

18. The fixing device of claim 10, wherein the first bracket comprises a first fastening portion, the second bracket comprises a second connecting portion, a third connecting portion, and a second fastening portion that are sequentially connected, the first fastening portion, the second connecting portion, the third connecting portion, the fourth connecting portion and the second fastening portion are sequentially connected to each other to form the cavity, the second connecting portion is opposite to the fourth connecting portion, the first connecting portion is rotatably connected to the second connecting portion, the second fastening portion rotatably connects to the fourth connecting portion, the first fastening portion and the second fastening portion are parallel to the third connecting portion and are engaged with the sliding buckle.

\* \* \* \* \*